(12) United States Patent  
Zhu et al.

(10) Patent No.: US 12,014,568 B2
(45) Date of Patent: Jun. 18, 2024

(54) DISPLAY PANEL AND DISPLAY DEVICE

(71) Applicant: BOE TECHNOLOGY GROUP CO., LTD., Beijing (CN)

(72) Inventors: Wenxiu Zhu, Beijing (CN); Bo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 418 days.

(21) Appl. No.: 17/431,385

(22) PCT Filed: Jan. 22, 2021

(86) PCT No.: PCT/CN2021/073189
§ 371 (c)(1),
(2) Date: Aug. 16, 2021

(87) PCT Pub. No.: WO2022/155871
PCT Pub. Date: Jul. 28, 2022

(65) Prior Publication Data
US 2022/0398862 A1    Dec. 15, 2022

(51) Int. Cl.
*G06V 40/13* (2022.01)
*G06F 3/041* (2006.01)
(Continued)

(52) U.S. Cl.
CPC ........ *G06V 40/1318* (2022.01); *G06F 3/0412* (2013.01); *G06F 3/0445* (2019.05);
(Continued)

(58) Field of Classification Search
CPC .. G06V 40/1318; G06V 10/147; G06V 40/13; G06F 3/0412; G06F 3/0445;
(Continued)

(56) References Cited

U.S. PATENT DOCUMENTS 9,836,165 B2 * 12/2017 Nho .................... G06V 40/1306
2017/0352708 A1 * 12/2017 Yamaguchi ............ H10K 50/17
(Continued)

FOREIGN PATENT DOCUMENTS

| CN | 107168465 A | 9/2017 |
| CN | 108242453 A | 7/2018 |

(Continued)

*Primary Examiner* — S M Sohel Imtiaz
(74) *Attorney, Agent, or Firm* — DINSMORE & SHOHL LLP

(57) ABSTRACT

Provided are a display panel and a display device. The display panel includes a base substrate; a sensor; a light-shielding layer, and having a plurality of first holes configured to allow light from a fingerprint to pass through and be incident on the sensor; an encapsulation layer; a color filter layer on one side of the encapsulation layer away from the base substrate; and a cover plate on one side of the color filter layer away from the base substrate, wherein a distance between a surface of the cover plate away from the base substrate and a surface of the light-shielding layer away from the base substrate is a first distance, a distance between a surface of the light-shielding layer close to the base substrate and a surface of the sensor close to the base substrate is a second distance, $0 < $ the second distance/the first distance $\leq 0.63$.

20 Claims, 4 Drawing Sheets

(51) Int. Cl.
*G06F 3/044* (2006.01)
*H10K 50/844* (2023.01)
*H10K 59/38* (2023.01)
*H10K 59/40* (2023.01)
*H10K 59/65* (2023.01)
*H10K 77/10* (2023.01)
*H10K 102/00* (2023.01)

(52) U.S. Cl.
CPC ........... *H10K 50/844* (2023.02); *H10K 59/38* (2023.02); *H10K 59/40* (2023.02); *H10K 59/65* (2023.02); *H10K 77/111* (2023.02); *H10K 2102/311* (2023.02)

(58) Field of Classification Search
CPC ...... H10K 50/844; H10K 59/38; H10K 59/40; H10K 59/65; H10K 77/111; H10K 2102/311; H10K 50/865
See application file for complete search history.

(56) References Cited

U.S. PATENT DOCUMENTS

| | | | |
|---|---|---|---|
| 2019/0006440 A1* | 1/2019 | Sun | H10K 59/65 |
| 2020/0242319 A1* | 7/2020 | Zeng | G06V 40/1318 |
| 2021/0103714 A1* | 4/2021 | Li | G06V 40/1329 |
| 2021/0286963 A1 | 9/2021 | Gao et al. | |
| 2021/0376003 A1 | 12/2021 | Xu et al. | |

FOREIGN PATENT DOCUMENTS

| | | |
|---|---|---|
| CN | 108388868 A | 8/2018 |
| CN | 108681703 A | 10/2018 |
| CN | 109784303 A | 5/2019 |
| CN | 208888842 U | 5/2019 |
| CN | 110163150 A | 8/2019 |
| CN | 110276312 A | 9/2019 |
| CN | 110277430 A | 9/2019 |
| CN | 111599846 A | 8/2020 |
| WO | 2020118699 A1 | 6/2020 |

* cited by examiner

DISPLAY PANEL AND DISPLAY DEVICE

CROSS-REFERENCE TO RELATED APPLICATIONS

The present application is a U.S. National Stage Application under 35 U.S.C. § 371 of International Patent Application No. PCT/CN2021/073189, filed on Jan. 22, 2021, the disclosure of which is incorporated by reference herein in its entirety.

TECHNICAL FIELD

The present disclosure relates to a display panel and a display device.

BACKGROUND

With the development of display technology, the under-screen fingerprint recognition technology is increasingly applied in the display panel. At the same time, in order to meet the demand for a thin and light display product, the thickness of the display panel is also continuously reduced.

SUMMARY

According to one aspect of the embodiments of the present disclosure, a display panel is provided. The display panel comprises: a base substrate; a sensor located on one side of the base substrate; a light-shielding layer located on one side of the base substrate away from the sensor, and having a plurality of first holes which is configured to allow light from a fingerprint to pass through and be incident on the sensor; an encapsulation layer located on the one side of the base substrate away from the sensor; a color filter layer located on one side of the encapsulation layer away from the base substrate; and a cover plate located on one side of the color filter layer away from the base substrate, wherein: a distance between a surface of the cover plate away from the base substrate and a surface of the light-shielding layer away from the base substrate is a first distance, and a distance between a surface of the light-shielding layer close to the base substrate and a surface of the sensor close to the base substrate is a second distance, wherein 0<the second distance/the first distance≤0.63.

In some embodiments, the plurality of first holes is configured to allow light from a plurality of first areas of the fingerprint to pass through and be incident on the sensor, wherein each first hole of the plurality of first holes is configured to allow light from a first area of the plurality of first areas to pass through and be incident on the sensor, and not allow light from an area of the fingerprint other than the first area to pass through and be incident on the sensor; and a distance between two geometric centers of any two adjacent first orthographic projections of a plurality of first orthographic projections of the plurality of first areas on the base substrate is a third distance, and a distance of an overlapped area of the two first orthographic projections along an extension direction of a line where the two geometric centers are situated is a fourth distance, wherein 0.1≤the fourth distance/the third distance≤1.

In some embodiments, the two adjacent first orthographic projections each is in a shape of a circle with a diameter of F; and a distance between two geometric centers of any two adjacent second orthographic projections of a plurality of second orthographic projections of the plurality of first holes on the base substrate is P, wherein $\sqrt{2}P \leq 0.9F$.

In some embodiments, the surface of the sensor close to the base substrate is a first surface; the plurality of first holes is configured to allow the light from the fingerprint to be incident on a plurality of second areas of the first surface, wherein each first hole of the plurality of first holes is configured to allow the light from the fingerprint to be incident on a second area of the plurality of second areas, and not allow the light from the fingerprint to be incident on an area of the first surface other than the second area; and any two adjacent third orthographic projections of a plurality of third orthographic projections of the plurality of second areas on the base substrate do not overlap with each other.

In some embodiments, the two adjacent third orthographic projections each is in a shape of a circle with a diameter of S; and a distance between two geometric centers of any two adjacent second orthographic projections of a plurality of second orthographic projections of the plurality of first holes on the base substrate is P, wherein P≥S.

In some embodiments, the plurality of first areas is in one-to-one correspondence to the plurality of first holes; and the plurality of second areas is in one-to-one correspondence to the plurality of first holes.

In some embodiments, the display panel further comprises: a connection layer located between the base substrate and the sensor; a base film located between the connection layer and the sensor, wherein a gas gap is provided between the base film and the sensor, and a refractive index of the base film is greater than a refractive index of the gas gap.

In some embodiments, a material of the base film comprises an organic material.

In some embodiments, the display panel further comprises: a driving circuit layer located between the base substrate and the encapsulation layer; and a light-emitting device layer located between the driving circuit layer and the encapsulation layer.

In some embodiments, the display panel further comprises: a touch panel located between the encapsulation layer and the color filter layer.

In some embodiments, the touch panel comprises: a protective layer; and a touch structure located between the protective layer and the encapsulation layer, and comprising: a first touch electrode layer, a second touch electrode layer, and an insulating layer located between the first touch electrode layer and the second touch electrode layer.

In some embodiments, the color filter layer comprises a plurality of filters spaced apart from each other; and the light-shielding layer is located between the touch panel and the cover plate, and comprises a black matrix comprising a plurality of first light-shielding portions spaced apart from each other, wherein each of the first light-shielding portions is located between two adjacent filters of the plurality of filters and has one of the plurality of first holes.

In some embodiments, the light-shielding layer is located between the base substrate and the driving circuit layer; the color filter layer comprises a plurality of filters spaced apart from each other; and the display panel further comprises a black matrix located between the touch panel and the cover plate, the black matrix comprising a plurality of second light-shielding portions spaced apart from each other and has a plurality of second holes, wherein: an orthographic projection of the plurality of first holes on the base substrate is located within an orthographic projection of the plurality of second holes on the base substrate, and each of the plurality of second light-shielding portions is located between two adjacent filters of the plurality of filters and has one of the plurality of second holes.

In some embodiments, a plurality of second orthographic projections of the plurality of first holes on the base substrate is in a same shape and has a same area.

In some embodiments, the same shape is a regular shape with a geometric center.

In some embodiments, the regular shape comprises a circle.

In some embodiments, a thickness of the connection layer is 10 micrometers to 100 micrometers; a thickness of the base film is 10 micrometers to 100 micrometers; and a thickness of the gas gap is 10 micrometers to 50 micrometers.

In some embodiments, a thickness of the color filter layer is 1 micrometer to 5 micrometers; a thickness of each of the protective layer and the insulating layer is 1 micrometer to 5 micrometers; a thickness of each of the first touch electrode layer and the second touch electrode layer is 0.2 micrometers to 0.6 micrometers; and a distance between a surface of the encapsulation layer away from the base substrate and a surface of the driving circuit layer close to the base substrate is 10 micrometers to 20 micrometers.

According to another aspect of the embodiments of the present disclosure, provided is a display panel, comprising: a base substrate; a sensor located on one side of the base substrate; a light-shielding layer located on one side of the base substrate away from the sensor and having a plurality of first holes; an encapsulation layer located on the one side of the base substrate away from the sensor; a color filter layer located on one side of the encapsulation layer away from the base substrate; and a cover plate located on one side of the color filter layer away from the base substrate, wherein: the plurality of first holes is configured to allow light from a plurality of first areas of a fingerprint to pass through and be incident on a plurality of second areas of a first surface of the sensor close to the base substrate, wherein each first hole of the plurality of first holes is configured to allow light from a first area of the plurality of first areas to pass through and be incident on a second area of the plurality of second areas, and not allow light from an area of the fingerprint other than the first area to be incident on an area of the first surface other than the second area; a distance between two geometric centers of any two adjacent first orthographic projections of a plurality of first orthographic projections of the plurality of first areas on the base substrate is a third distance, and a distance of an overlapped area of the two adjacent first orthographic projections along an extension direction of a line where the two geometric centers are situated is a fourth distance, wherein 0.1≤the fourth distance/the third distance≤1; and any two adjacent third orthographic projections of a plurality of third orthographic projections of the plurality of second areas on the base substrate do not overlap with each other.

According to a further aspect of the embodiments of the present disclosure, a display device is provided. The display device comprises: the display panel according to any one of the above embodiments.

BRIEF DESCRIPTION OF THE DRAWINGS

The accompanying drawings which constitute part of this specification, illustrate the exemplary embodiments of the present disclosure, and together with this specification, serve to explain the principles of the present disclosure.

The present disclosure may be more explicitly understood from the following detailed description with reference to the accompanying drawings, in which.

Figure 1A:
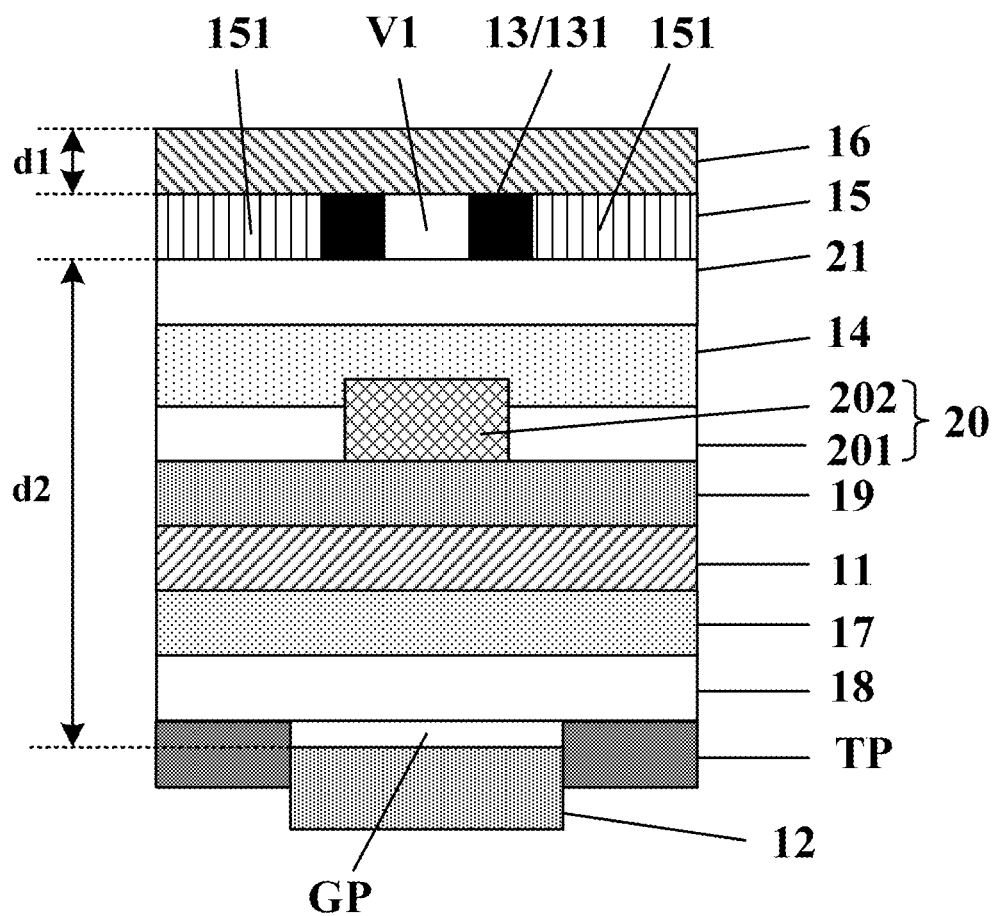
FIG. 1A is a schematic structure view showing a display panel according to an embodiment of the present disclosure.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, the optical fingerprint recognition technology applies the principle of pinhole imaging. The light emitted by a light-emitting device in the display panel is incident on the fingerprint and enters a pinhole after being reflected by the fingerprint, and then received by a sensor for imaging. The inventors have noticed that, as the thickness of the display panel decreases, it is possible to result that the overlapped area between adjacent images of the light incident on the sensor is too large, or the overlapped area between adjacent areas of the fingerprint that can be recognized by the pinhole is too small. In this way, part of the information of the fingerprint may be lost, thereby affecting the accuracy of fingerprint recognition.

In view of the above, the embodiments of the present disclosure provide the following technical solutions.

Figure 1B:
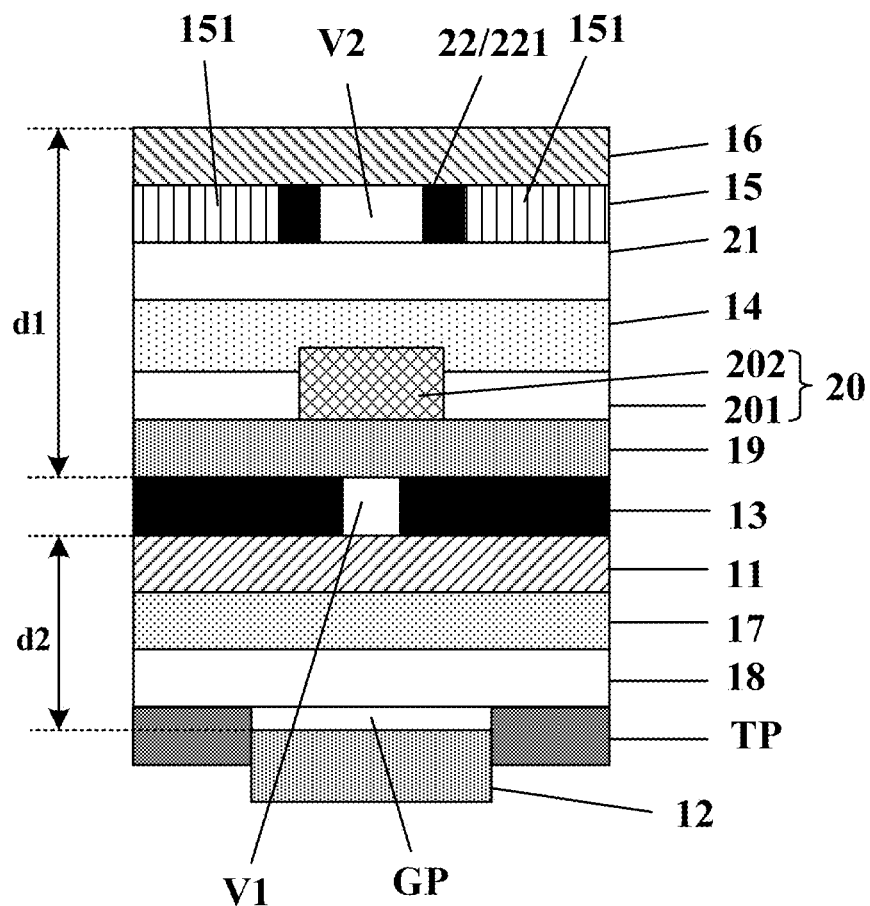
FIG. 1B is a schematic structure view showing a display panel according to another embodiment of the present disclosure.

FIG. 1A is a schematic structure view showing a display panel according to an embodiment of the present disclosure. FIG. 1B is a schematic structure view showing a display panel according to another embodiment of the present disclosure. The display panels according to some embodiments of the present disclosure will be described below in conjunction with FIGS. 1A and 1B.

As shown in FIGS. 1A and 1B, the display panel comprises a base substrate 11, a sensor 12 (may also be referred to as fingerprint recognition senor), a light-shielding layer 13, an encapsulation layer 14, a color filter layer 15 and a cover plate 16.

The base substrate 11 may be, for example, a flexible substrate. In some embodiments, the material of the base substrate 11 may comprise polyimide (PI) or the like. For example, the thickness of the base substrate 11 is 10 micrometers to 50 micrometers, for example 20 micrometers, 30 micrometers, 40 micrometers, etc.

The sensor 12 is located on one side of the base substrate 11. For example, FIGS. 1A and 1B schematically show that the sensor 12 is located on a lower side of the base substrate 11. In some embodiments, the sensor 12 may be a PIN-type photodiode, a CMOS (Complementary Metal-Oxide-Semiconductor) image sensor, or a CCD (Charge-coupled Device) image sensor. For example, the thickness of the sensor 12 is 1 mm to 3 mm, for example 2 mm, 2.5 mm, etc.

The light-shielding layer 13 is located on one side of the base substrate 11 away from the sensor 12. For example, FIGS. 1A and 1B schematically show that the light-shielding layer 13 is located on an upper side of the base substrate 11. It should be noted that, the light-shielding layer 13 may be located at different positions of the display panel, which will be described in detail later in conjunction with different implementations.

Referring to FIGS. 1A and 1B, the light-shielding layer 13 has a plurality of first holes V1 which is configured to allow light from a fingerprint to pass through and then be incident on the sensor 12. Here, the fingerprint may comprise, but is not limited to, the fingerprint of a finger.

In some embodiments, two or more pixels may be provided between two adjacent first holes V1. Here, each pixel comprises a plurality of sub-pixels, which may comprise a red sub-pixel, a green sub-pixel, or a blue sub-pixel. In other words, one first hole V1 may be provided at an interval of a plurality of pixels.

The encapsulation layer 14 is located on one side of the base substrate 11 away from the sensor 12. In some embodiments, the encapsulation layer 14 may be a thin film encapsulation layer. For example, the encapsulation layer 14 may comprise a first inorganic layer, a second inorganic layer, and an organic layer located between the first inorganic layer and the second inorganic layer.

The color filter layer 15 is located on one side of the encapsulation layer 14 away from the base substrate 11. For example, the color filter layer 15 may comprise a plurality of filters 151 spaced apart from each other, for example, a red filter, a green filter, a blue filter, or the like. In some embodiments, the color filter layer 15 may further comprise a protective layer, for example, a silicon oxide layer or a silicon nitride layer, located between the plurality of filters and the cover plate 16. The thickness of the protective layer may be, for example, 1 micrometer to 5 micrometers, for example, 2 micrometers, 3 micrometers, etc.

The cover plate 16 is located on one side of the color filter layer 15 away from the base substrate 11. In some embodiments, the cover plate may comprise at least one stacked layer.

For example, each stacked layer may comprise a cover layer and an adhesive layer located between the cover layer and the color filter layer 15. As some implementations, the cover layer may comprise glass, PET (Polyethylene terephthalate), or CPI (Colorless Polyimide). As some implementations, the adhesive layer may be OCA (Optically Clear Adhesive). For example, the cover plate 16 may comprise a stacked layer of glass and OCA. For another example, the cover plate 16 may comprise a stacked layer of PET and OCA. For still another example, the cover plate 16 may comprise a stacked layer of CPI and OCA. For yet still another example, the cover plate 16 may comprise a stacked layer of CPI, OCA, CPI, and OCA. For example, the thickness of the glass as the cover layer may be 300 micrometers to 700 micrometers, and the thickness of the PET and CPI as the cover layer may be 50 micrometers to 150 micrometers. For example, the thickness of the adhesive layer may be 30 micrometers to 150 micrometers.

Referring to FIGS. 1A and 1B, the distance between a surface of the cover plate 16 away from the base substrate 11 and a surface of the light-shielding layer 13 away from the base substrate 11 is a first distance d1, and the distance between a surface of the light-shielding layer 13 close to the base substrate 11 and a surface of the sensor 12 close to the base substrate 11 is a second distance d2.

The inventors have noticed that, the overlapped area between adjacent images and the overlapped area between adjacent areas of the fingerprint that can be recognized can be adjusted by adjusting a ratio between the second distance d2 and the first distance d1. In the case where 0<the second distance d2/the first distance d1≤0.63, the overlapped area of adjacent images and the overlapped area of adjacent areas of the fingerprint that can be recognized can be balanced. As some implementations, the second distance d2/the first distance d1 may be 0.5, 0.4, 0.3, etc.

In the above embodiments, 0<the second distance d2/the first distance d1≤0.63. Under such a condition, the overlapped area between adjacent images can be reduced, and the overlapped area between adjacent areas of the fingerprint that can be identified can be increased, thereby improving the accuracy of fingerprint recognition of the display panel.

In some embodiments, referring to FIG. 1A and FIG. 1B, the display panel further comprises a connection layer 17 and a base film 18. Some implementations of the connection layer 17 and the base film 18 will be described below.

The connection layer 17 is located between the base substrate 11 and the sensor 12. For example, the connection layer 17 may comprise pressure-sensitive adhesive. In some embodiments, the thickness of the connection layer 17 may be 10 micrometers to 100 micrometers, for example, 30 micrometers, 50 micrometers, 80 micrometers, etc.

The base film 18 is located between the connection layer 17 and the sensor 12, and a gas gap GP is provided between the base film 18 and the sensor 12. In addition, the refractive index of the base film 18 is greater than the refractive index of the gas gap GP. For example, the material of the base film 18 may comprise an organic layer, for example PI or PET. As some implementations, the gas gap GP may be an air gap. In some embodiments, the thickness of the base film 18 is 10 micrometers to 100 micrometers, for example, 20 micrometers, 40 micrometers, micrometers, 80 micrometers, etc. In some embodiments, the thickness of the gas gap GP is 10 to 50 micrometers, for example, 20 micrometers, 30 micrometers, 40 micrometers, etc.

For example, the base film 18 may be adhesive to the sealant TP, and the sensor 12 may be adhesive to the sealant TP. In this case, the gas gap GP may be defined by the sealant TP, the sensor 12 and the base film 18.

In some embodiments, another cover layer may be provided on a surface of the sensor 12 close to the base substrate 11. The thickness of this another cover layer may be 10 micrometers to 200 micrometers, for example 50 micrometers, 150 micrometers, etc.

Assuming that the total reflection angle at the interface between the base film 18 and the gas gap GP is α, for the light incident on the interface between the base film 18 and the gas gap GP, the light with an incident angle greater than or equal to α will be transmitted by total reflection in the base film 18, while the light with an incident angle of smaller than α will be incident on the gas gap GP and then incident on the sensor 12. The light incident on the sensor 12 can be adjusted by adjusting the refractive index of the base film 18 and the refractive index of the gas gap GP.

In some embodiments, referring to FIGS. 1A and 1B, the display panel further comprises a driving circuit layer 19 and a light-emitting device layer 20.

The driving circuit layer 19 is located between the base substrate 11 and the encapsulation layer 14. For example, the driving circuit layer 19 may comprise a plurality of pixel driving circuits for driving a plurality of sub-pixels. As some implementations, each pixel driving circuit may comprise seven thin film transistors and one capacitor (7T1C). As other implementations, each pixel driving circuit may comprise six thin film transistors and one capacitor (6T1C).

The light-emitting device layer 20 is located between the driving circuit layer 19 and the encapsulation layer 14. The light-emitting device layer 20 may comprise a plurality of light-emitting devices 201 and a pixel defining layer 202 for defining a plurality of sub-pixels. The orthographic projection of each first hole V1 on the base substrate 11 is located within the orthographic projection of the pixel defining layer 202 on the base substrate 11. For example, the light-emitting device 201 may comprise an OLED (Organic Light-Emitting Diode). In some embodiments, the light-emitting device layer 20 may further comprise a support layer for supporting a mask, the support layer is located on one side of the pixel defining layer 202 away from the base substrate 11 (not shown in FIGS. 1A and 1B).

In some embodiments, the distance between a surface of the encapsulation layer 14 away from the base substrate 11 and a surface of the driving circuit layer 19 close to the base substrate 11 is 10 micrometers to 20 micrometers, for example, 12 micrometers, 15 micrometers, 18 micrometers, etc.

In some embodiments, referring to FIGS. 1A and 1B, the display panel may further comprise a touch panel 21 located between the encapsulation layer 14 and the color filter layer 15.

Figure 2:
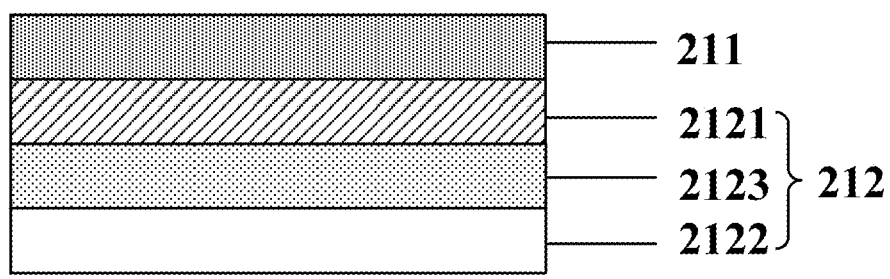
FIG. 2 is a schematic structure view showing a touch panel according to an implementation of the present disclosure.

FIG. 2 is a schematic structure view showing a touch panel according to an implementation of the present disclosure.

As shown in FIG. 2, the touch panel 21 comprises a protective layer 211 and a touch structure 212 located between the protective layer 211 and the encapsulation layer 14. The touch structure 212 may comprise a first touch electrode layer 2121, a second touch electrode layer 2122, and an insulating layer 2123 located between the first touch electrode layer 2121 and the second touch electrode layer 2122. For example, the first touch electrode layer 2121 may comprise a plurality of first electrodes spaced apart, and the second touch electrode layer 2122 may comprise a plurality of second electrodes spaced apart. A plurality of capacitors may be formed between the plurality of first electrodes and the plurality of second electrodes. As some examples, the materials of the protective layer 211 and the insulating layer 2123 may comprise silicon oxide or silicon nitride.

In some embodiments, the thickness of each of the protective layer 211 and the insulating layer 2123 is 1 micrometer to 5 micrometers. In some embodiments, the thickness of each of the first touch electrode layer 2121 and the second touch electrode layer 2122 is 0.2 micrometers to 0.6 micrometers, for example, 0.4 micrometers, 0.5 micrometers, etc.

Different implementations of the light-shielding layer 13 will be described below in conjunction with FIGS. 1A and 1B.

In some implementations, referring to FIG. 1A, the light-shielding layer 13 is located between the touch panel 21 and the cover plate 16, and the light-shielding layer 13 comprises a black matrix.

Here, the black matrix comprises a plurality of first light-shielding portions 131 spaced apart from each other. Each of the first light-shielding portions 131 is located between two adjacent filters 151, and each of the first light-shielding portions 131 has one of the plurality of first holes V1. In other words, the plurality of first light-shielding portions 131 is in one-to-one correspondence to the plurality of first holes V1. For example, the thickness of the black matrix is 1 micrometer to 5 micrometers, for example, 2 micrometers, 3 micrometers, 4 micrometers, etc.

In other implementations, referring to FIG. 1B, the light-shielding layer 13 is located between the base substrate 11 and the driving circuit layer 19, and the display panel further comprises a black matrix 22 located between the touch panel 21 and the cover plate 16. For example, the material of the light-shielding layer 13 may comprise metal, for example, silver or the like.

The black matrix 22 comprises a plurality of second light-shielding portions 221 having a plurality of second holes V2. The orthographic projection of the plurality of first holes V1 on the base substrate 11 is located within the orthographic projection of the plurality of second holes V2 on the base substrate 11. For example, the diameter of the orthographic projection of the second hole V2 on the base substrate 11 is about 30 micrometers, and the diameter of the orthographic projection of the first hole V1 on the base substrate 11 is 5 micrometers to 10 micrometers.

Each of the second light-shielding portions 221 is located between two adjacent filters 151 and has one of the plurality of second holes V2. For example, the plurality of first holes V1 is in one-to-one correspondence to the plurality of second holes V2, and the orthographic projection of each first hole V1 on the base substrate 11 is located within the orthographic projection of a corresponding second hole V2 on the base substrate 11.

In the implementations shown in FIG. 1A, the light-shielding layer may be implemented as a black matrix; in the implementations shown in FIG. 1B, the light-shielding layer may be implemented as a layer different from the black matrix.

Figure 3:
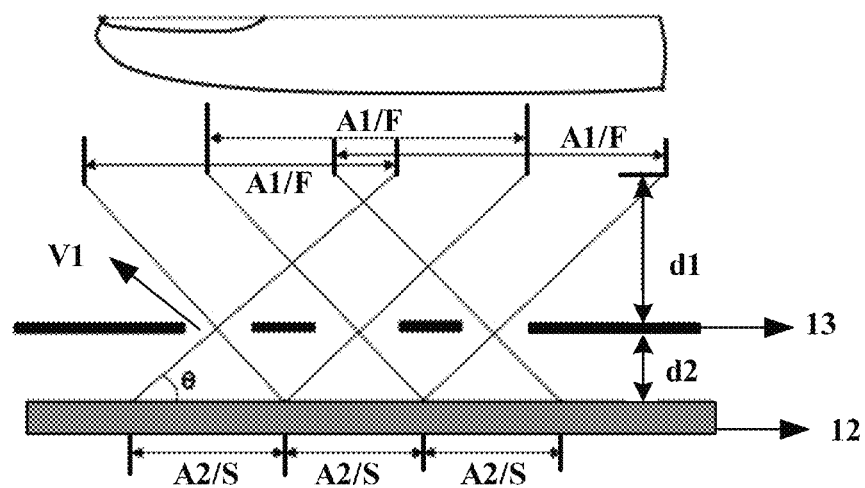
FIG. 3 is a schematic view showing the principle of fingerprint recognition according to an embodiment of the present disclosure.

FIG. 3 is a schematic view showing the principle of fingerprint recognition according to an embodiment of the present disclosure.

As shown in FIG. 3, the plurality of first holes V1 is configured to allow light from the plurality of first areas A1 of the fingerprint to passed through and then be incident on the sensor 12. Here, each first hole V1 is configured to allow light from a first area A1 of the plurality of first areas A1 to pass through and then be incident on the sensor 12, and not allow light from an area of the fingerprint other than the first area A1 to be incident on the sensor 12. In other words, each first area A1 is the largest area of the fingerprint that can be identified by a corresponding first hole V1.

FIG. 3 schematically shows three first areas A1, adjacent first areas A1 overlap with each other. In some embodiments, the first area A1 is in a shape of a circle with a diameter F.

Figure 4A:
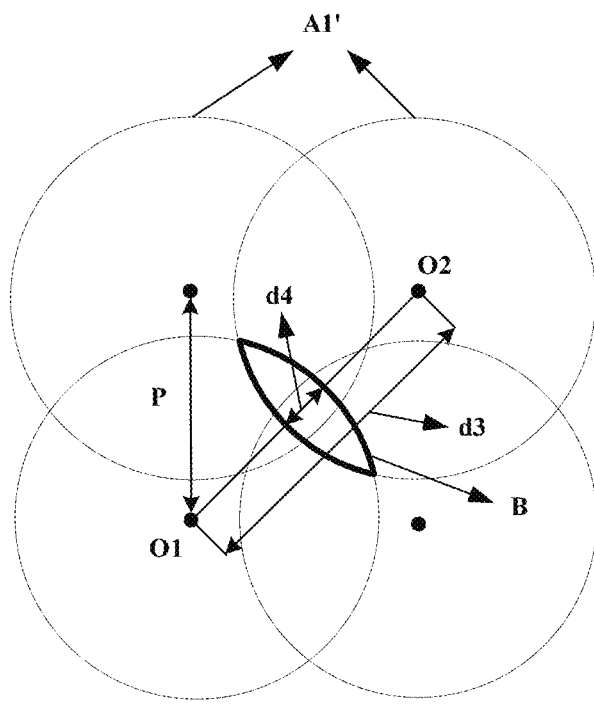
FIG. 4A is a schematic view showing the orthographic projection of a plurality of first areas on the base substrate according to an embodiment of the present disclosure.

FIG. 4A is a schematic view showing the orthographic projection of a plurality of first areas on the base substrate according to an embodiment of the present disclosure.

As shown in FIG. 4A, the distance between two geometric centers of any two adjacent first orthographic projections A1' of the plurality of first orthographic projections A1' of the plurality of first areas A1 on the base substrate 11 is a third distance d3. In addition, the distance between the overlapped area B of the two adjacent first orthographic projections A1' along an extension direction of a line where the two geometric centers are situated is a fourth distance d4. In some embodiments, the plurality of first areas A1 are in one-to-one correspondence to the plurality of first holes V1.

For example, the distance between the geometric center O1 and the geometric center O2 is the third distance d3, and the distance between the overlapped area B of the two adjacent first orthographic projections A1' along an extension direction of the line where the geometric center O1 and the geometric center O2 are situated is the fourth distance d4. In other words, the length of a portion of the line segment O1O2 within the area B is d4.

In some embodiments, the third distance d3 and the fourth distance d4 satisfy the following condition: 0.1≤the fourth distance d4/the third distance d3≤1. In this way, the overlapped area of adjacent first areas A1 can be prevented from being too small, thereby improving the accuracy of fingerprint recognition.

In some embodiments, the two adjacent first orthographic projections A1' each is in a shape of a circle with a diameter of F, and the distance between two geometric centers of any two adjacent second orthographic projections of the plurality of second orthographic projections of the plurality of first holes V1 on the base substrate 11 is P. It should be noted that, the distance between two geometric centers of two adjacent first orthographic projections A1' is also P, as shown in FIG. 4A. P and F satisfy the following condition: √2P≤0.9F. Under such a condition, the overlapped area of adjacent first areas A1 can be prevented from being too small, thereby improving the accuracy of fingerprint recognition.

In one or more embodiments, the plurality of second orthographic projections of the plurality of first holes V1 on the base substrate 11 is in a same shape and has a same area. For example, each of the second orthographic projections is in a regular shape with a geometric center, for example, in a shape of a circle. In some embodiments, the diameter of each second orthographic projection is 5 micrometers to 10 micrometers, for example, 7 micrometers, 9 micrometers, etc.

In some embodiments, referring to FIG. 3, a surface of the sensor 12 close to the base substrate 11 is a first surface, and the plurality of first holes V1 is configured to allow light from the fingerprint to be incident on the plurality of second areas A2 of the first surface. Here, each first hole V1 is configured to allow the light from the fingerprint to be incident on a second area A2 of the plurality of second areas A2, and not allow the light from the fingerprint to be incident on an area of the first surface other than the second area A2. In other words, each second area A2 is an imaging area of light from a corresponding first hole V1.

FIG. 3 schematically shows three second areas A2. In some embodiments, the second area A2 is in a shape of a circle with a diameter of S.

Figure 4B:
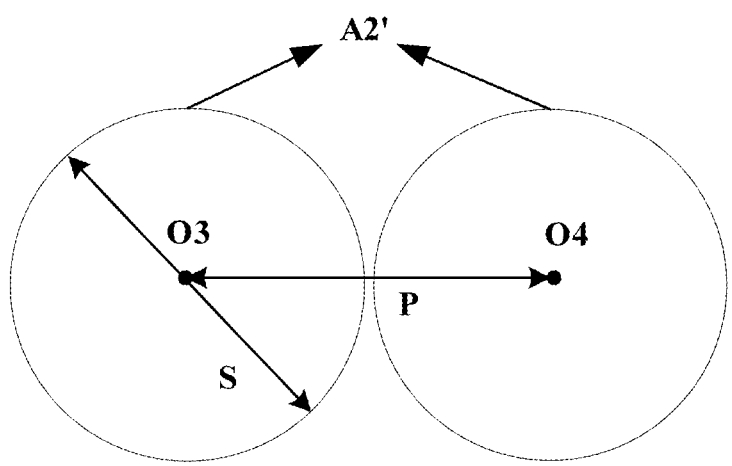
FIG. 4B is a schematic view showing the orthographic projection of a plurality of second areas on the base substrate according to an embodiment of the present disclosure.

FIG. 4B is a schematic view showing the orthographic projection of a plurality of second areas on the base substrate according to an embodiment of the present disclosure.

As shown in FIG. 4B, any two adjacent third orthographic projections A2' of the plurality of third orthographic projections A2' of the plurality of second areas A2 on the base substrate 11 do not overlap with each other. In some embodiments, the plurality of second areas A2 is in one-to-one correspondence to the plurality of first holes V1. In this manner, overlapping of adjacent second areas A2 is avoided, thereby improving the accuracy of fingerprint recognition of the display panel.

In some embodiments, two adjacent third orthographic projections A2' each is in a shape of a circle with a diameter of S, and the distance between two geometric centers of any two adjacent second orthographic projections of the plurality of second orthographic projections of the plurality of first holes V1 on the base substrate 11 is P. It should be noted that, the distance between two geometric centers of two adjacent third orthographic projections A2' is also P, as shown in FIG. 4B. P and S satisfy the following condition: P≥S. Under such a condition, overlapping of the adjacent second areas A2 is avoided, thereby improving the accuracy of fingerprint recognition of the display panel.

In some embodiments, the accuracy of fingerprint recognition of the display panel can be adjusted by adjusting the value of the distance P between two geometric centers of two adjacent second orthographic projections, which will be described below in conjunction with FIG. 3 assuming that each of the first area and the second area is in a shape of a circular.

As described above, the light with an incident angle smaller than α can be incident on the sensor 12. In FIG. 3, θ=90°−α. The light with a comprised angle greater than or equal to θ with the first surface of the sensor 12 close to the base substrate 11 can be incident on the sensor 12. The diameter of the first area A1 is F=2×d1/tan θ, and the diameter of the second area A2 is S=2×d2/tan θ.

In order to ensure the integrity of the fingerprint information, the following conditions should be satisfied: √2P≤0.9F, and P≥S. That is, 2×d2/tan θ≤P≤0.9√2×d1/tan θ. Thus, d2/d1≤9√2/20.

It can be seen that, in a case where d2/d1≤0.63, the overlapped area between adjacent images can be reduced, and the overlapped area between adjacent areas of the fingerprint that can be identified can be increased, thereby improving the accuracy of fingerprint recognition of the display panel.

The embodiments of the present disclosure also provide another display panel, which will be described below in conjunction with FIGS. 1A, 1B, 3, 4A, and 4B.

As shown in FIGS. 1A and 1B, the display panel comprises a base substrate 11, a sensor 12, a light-shielding layer 13, an encapsulation layer 14, a color filter layer 15 and a cover plate 16.

The sensor 12 is located on one side of the base substrate 11, the light-shielding layer 13 is located on one side of the base substrate 11 away from the sensor 12, the encapsulation layer 14 is located on one side of the base substrate 11 away from the sensor 12, the color filter layer 15 is located on one side of the encapsulation layer 14 away from the base substrate 11, and the cover plate 16 is located on one side of the color filter layer 15 away from the base substrate 11.

As shown in FIG. 3, the plurality of first holes V1 is configured to allow light from a plurality of first areas A1 of the fingerprint to pass through and then be incident on a plurality of second areas A2 of the first surface of the sensor 12 close to the base substrate 11. Here, each first hole V1 is configured to allow light from a first area A1 of the plurality of first areas A1 to pass through and then be incident on a second area A2 of the plurality of second areas A2, and not allow light from an area of the fingerprint other than the first area A1 be incident on an area of the first surface of the sensor 12 other than the second area A2. In other words, each first area A1 is the largest area of the fingerprint that can be identified by a corresponding first hole V1, and each second area A2 is an imaging area of light from a corresponding first hole V1.

As shown in FIG. 4A, the distance between two geometric centers of any two adjacent first orthographic projections A1' of the plurality of first orthographic projections A1' of the plurality of first areas A1 on the base substrate 11 is a third distance d3. In addition, the distance of the overlapped area B of the two adjacent first orthographic projections A1' along an extension direction of the line where the two geometric centers are situated is a fourth distance d4. The third distance d3 and the fourth distance d4 satisfy the following condition: 0.1≤the fourth distance d4/the third distance d3≤1.

As shown in FIG. 4B, any two adjacent third orthographic projections A2' of the plurality of third orthographic projections A2' of the plurality of second areas A2 on the base substrate 11 do not overlap with each other.

The display panel in the above embodiments can avoid that the overlapped area of adjacent first areas A1 is too small, and avoid overlapping of adjacent second areas A2, thereby improving the accuracy of fingerprint recognition of the display panel.

Figure 5:
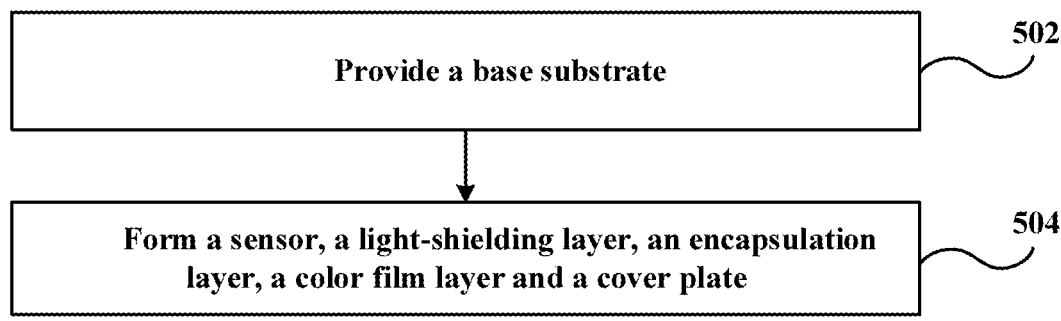
FIG. 5 is a schematic flowchart showing a manufacturing method of a display panel according to an embodiment of the present disclosure.

FIG. 5 is a schematic flowchart showing a manufacturing method of a display panel according to an embodiment of the present disclosure.

At step 502, a base substrate is provided.

At step 504, a sensor, a light-shielding layer, an encapsulation layer, a color filter layer and a cover plate are formed.

Here, the sensor is located on one side of the base substrate, and the light-shielding layer and the encapsulation layer are located on one side of the base substrate away from the sensor. The light-shielding layer has a plurality of first holes, which is configured to allow light from the fingerprint to pass through and then be incident on the sensor. The color filter layer is located on one side of the encapsulation layer away from the base substrate, and the cover plate is located on one side of the color filter layer away from the base substrate.

For example, the light-shielding layer, the encapsulation layer, the color filter layer and the cover plate may be formed first on one side of the base substrate, and then the sensor is formed on the other side of the base substrate. For another example, the sensor may be formed first on one side of the base substrate, and then the light-shielding layer, the encapsulation layer, the color filter layer and the cover plate are formed on the other side of the base substrate.

The distance between a surface of the cover plate away from the base substrate and a surface of the light-shielding layer away from the base substrate is a first distance d1, and the distance between a surface of the light-shielding layer close to the base substrate and a surface of the sensor close to the base substrate is a second distance d2, where 0<d2/d1≤0.63.

In the above embodiments, by setting the value of the second distance d2/first distance d1 to be greater than 0 and smaller than or equal to 0.63, the overlapped area between adjacent images can be reduced, and the overlapped area between adjacent areas of the fingerprint that can be identified can be increased, thereby improving the accuracy of fingerprint recognition of the display panel.

The present disclosure also provides a display device, which may comprise the display panel according to any one of the above embodiments. In some embodiments, the display device may be any product or member having a display function, such as a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
a base substrate;
a sensor located on one side of the base substrate;
a light-shielding layer located on one side of the base substrate away from the sensor, and having a plurality of first holes which is configured to allow light from a fingerprint to pass through and be incident on the sensor;

an encapsulation layer located on the one side of the base substrate away from the sensor;

a driving circuit layer located between the base substrate and the encapsulation layer;

a light-emitting device layer located between the driving circuit layer and the encapsulation layer;

a color filter layer located on one side of the encapsulation layer away from the base substrate; and a cover plate located on one side of the color filter layer away from the base substrate, wherein:

a distance between a surface of the cover plate away from the base substrate and a surface of the light-shielding layer away from the base substrate is a first distance, and a distance between a surface of the light-shielding layer close to the base substrate and a surface of the sensor close to the base substrate is a second distance, wherein 0<the second distance/the first distance≤0.63.

2. The display panel according to claim 1, wherein:

the plurality of first holes is configured to allow light from a plurality of first areas of the fingerprint to pass through and be incident on the sensor, wherein each first hole of the plurality of first holes is configured to allow light from a first area of the plurality of first areas to pass through and be incident on the sensor, and not allow light from an area of the fingerprint other than the first area to pass through and be incident on the sensor; and a distance between two geometric centers of any two adjacent first orthographic projections of a plurality of first orthographic projections of the plurality of first areas on the base substrate is a third distance, and a distance of an overlapped area of the two first orthographic projections along an extension direction of a line where the two geometric centers are situated is a fourth distance, wherein 0.1≤the fourth distance/the third distance≤1.

3. The display panel according to claim 2, wherein:

the two adjacent first orthographic projections each is in a shape of a circle with a diameter of F; and a distance between two geometric centers of any two adjacent second orthographic projections of a plurality of second orthographic projections of the plurality of first holes on the base substrate is P, wherein √2P≤0.9F.

4. The display panel according to claim 2, wherein:

the surface of the sensor close to the base substrate is a first surface;

the plurality of first holes is configured to allow the light from the fingerprint to be incident on a plurality of second areas of the first surface, wherein each first hole of the plurality of first holes is configured to allow the light from the fingerprint to be incident on a second area of the plurality of second areas, and not allow the light from the fingerprint to be incident on an area of the first surface other than the second area; and any two adjacent third orthographic projections of a plurality of third orthographic projections of the plurality of second areas on the base substrate do not overlap with each other.

5. The display panel according to claim 4, wherein:

the two adjacent third orthographic projections each is in a shape of a circle with a diameter of S; and a distance between two geometric centers of any two adjacent second orthographic projections of a plurality of second orthographic projections of the plurality of first holes on the base substrate is P, wherein P<S.

6. The display panel according to claim 4, wherein:

the plurality of first areas is in one-to-one correspondence to the plurality of first holes; and the plurality of second areas is in one-to-one correspondence to the plurality of first holes.

7. The display panel according to claim 1, further comprising:

a connection layer located between the base substrate and the sensor;

a base film located between the connection layer and the sensor, wherein a gas gap is provided between the base film and the sensor, and a refractive index of the base film is greater than a refractive index of the gas gap.

8. The display panel according to claim 7, wherein a material of the base film comprises an organic material.

9. The display panel according to claim 1, further comprising:

a touch panel located between the encapsulation layer and the color filter layer.

10. The display panel according to claim 9, wherein the touch panel comprises:

a protective layer; and a touch structure located between the protective layer and the encapsulation layer, and comprising:

a first touch electrode layer, a second touch electrode layer, and an insulating layer located between the first touch electrode layer and the second touch electrode layer.

11. The display panel according to claim 9, wherein:

the color filter layer comprises a plurality of filters spaced apart from each other; and the light-shielding layer is located between the touch panel and the cover plate, and comprises a black matrix comprising a plurality of first light-shielding portions spaced apart from each other, wherein each of the first light-shielding portions is located between two adjacent filters of the plurality of filters and has one of the plurality of first holes.

12. The display panel according to claim 9, wherein:

the light-shielding layer is located between the base substrate and the driving circuit layer;

the color filter layer comprises a plurality of filters spaced apart from each other; and the display panel further comprises a black matrix located between the touch panel and the cover plate, the black matrix comprising a plurality of second light-shielding portions spaced apart from each other and has a plurality of second holes, wherein:

an orthographic projection of the plurality of first holes on the base substrate is located within an orthographic projection of the plurality of second holes on the base substrate, and each of the plurality of second light-shielding portions is located between two adjacent filters of the plurality of filters and has one of the plurality of second holes.

13. The display panel according to claim 1, wherein a plurality of second orthographic projections of the plurality of first holes on the base substrate is in a same shape and has a same area.

14. The display panel according to claim 13, wherein the same shape is a regular shape with a geometric center.

15. The display panel according to claim 14, wherein the regular shape comprises a circle.

16. The display panel according to claim 7, wherein:
a thickness of the connection layer is 10 micrometers to 100 micrometers;
a thickness of the base film is 10 micrometers to 100 micrometers; and
a thickness of the gas gap is 10 micrometers to 50 micrometers.

17. The display panel according to claim 10, wherein:
a thickness of the color filter layer is 1 micrometer to 5 micrometers;
a thickness of each of the protective layer and the insulating layer is 1 micrometer to 5 micrometers;
a thickness of each of the first touch electrode layer and the second touch electrode layer is 0.2 micrometers to 0.6 micrometers; and
a distance between a surface of the encapsulation layer away from the base substrate and a surface of the driving circuit layer close to the base substrate is 10 micrometers to 20 micrometers.

18. A display device, comprising the display panel according to claim 1.

19. A display panel, comprising:
a base substrate;
a sensor located on one side of the base substrate;
a light-shielding layer located on one side of the base substrate away from the sensor, and having a plurality of first holes which is configured to allow light from a fingerprint to pass through and be incident on the sensor;
an encapsulation layer located on the one side of the base substrate away from the sensor;
a color filter layer located on one side of the encapsulation layer away from the base substrate;
a cover plate located on one side of the color filter layer away from the base substrate, wherein:
a distance between a surface of the cover plate away from the base substrate and a surface of the light-shielding layer away from the base substrate is a first distance, and
a distance between a surface of the light-shielding layer close to the base substrate and a surface of the sensor close to the base substrate is a second distance, wherein 0<the second distance/the first distance≤0.63, wherein:
the surface of the sensor close to the base substrate is a first surface,
the plurality of first holes is configured to allow the light from the fingerprint to be incident on a plurality of second areas of the first surface, wherein each first hole of the plurality of first holes is configured to allow the light from the fingerprint to be incident on a second area of the plurality of second areas, and not allow the light from the fingerprint to be incident on an area of the first surface other than the second area, and
any two adjacent third orthographic projections of a plurality of third orthographic projections of the plurality of second areas on the base substrate do not overlap with each other.

20. A display panel, comprising:
a base substrate;
a sensor located on one side of the base substrate;
a connection layer located between the base substrate and the sensor;
a base film located between the connection layer and the sensor, wherein a gas gap is provided between the base film and the sensor, and a refractive index of the base film is greater than a refractive index of the gas gap;
a light-shielding layer located on one side of the base substrate away from the sensor, and having a plurality of first holes which is configured to allow light from a fingerprint to pass through and be incident on the sensor;
an encapsulation layer located on the one side of the base substrate away from the sensor;
a color filter layer located on one side of the encapsulation layer away from the base substrate; and
a cover plate located on one side of the color filter layer away from the base substrate, wherein:
a distance between a surface of the cover plate away from the base substrate and a surface of the light-shielding layer away from the base substrate is a first distance, and
a distance between a surface of the light-shielding layer close to the base substrate and a surface of the sensor close to the base substrate is a second distance, wherein 0<the second distance/the first distance≤0.63.

* * * * *